(12) United States Patent
Miura et al.

(10) Patent No.: US 7,679,086 B2
(45) Date of Patent: Mar. 16, 2010

(54) METHOD FOR MANUFACTURING ELECTRO-OPTIC DEVICE

(75) Inventors: Eiichi Miura, Chitose (JP); Atsuhito Matsuo, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 629 days.

(21) Appl. No.: 11/708,206

(22) Filed: Feb. 20, 2007

(65) Prior Publication Data

US 2007/0197036 A1    Aug. 23, 2007

(30) Foreign Application Priority Data

Feb. 20, 2006   (JP)   ............................. 2006-042013
Nov. 30, 2006   (JP)   ............................. 2006-323099

(51) Int. Cl.
  *H01L 31/00*   (2006.01)
(52) U.S. Cl. ............................. 257/59; 257/71; 257/98; 438/745; 438/753
(58) Field of Classification Search ....................... None
See application file for complete search history.

(56) References Cited

U.S. PATENT DOCUMENTS

| 6,806,917 | B2 * | 10/2004 | Sekine et al. | ................. 349/43 |
| 2002/0160553 | A1 * | 10/2002 | Yamanaka et al. | .......... 438/149 |
| 2004/0256618 | A1 * | 12/2004 | Imai et al. | ..................... 257/59 |
| 2006/0199382 | A1 * | 9/2006 | Sugiyama et al. | ........... 438/670 |

FOREIGN PATENT DOCUMENTS

| JP | 10-172880 A | 6/1998 |
| JP | 2000-176360 A | 6/2000 |
| JP | 2001-339069 A | 12/2001 |
| JP | 2002-177854 A | 6/2002 |
| JP | 2003-068693 | 3/2003 |
| JP | 2005-221541 A | 8/2005 |

* cited by examiner

*Primary Examiner*—Duy-Vu N Deo
(74) *Attorney, Agent, or Firm*—AdvantEdge Law Group, LLC

(57) ABSTRACT

A method for manufacturing an electro-optic device includes an electroconductive film forming step that forms an electroconductive film over surfaces of a substrate. A front electroconductive film removing step is also performed which removes the electroconductive film from the front surface of the substrate. A thin layer forming step is performed to form thin layers on the front surface of the substrate. Then, a rear electroconductive film removing step is performed which removes the electroconductive film from the rear surface of the substrate. At least one of the front electroconductive film removing step and the rear electroconductive film removing step is performed by applying a chemical agent capable of etching with the substrate rotated, to the rotation center of the surface of the substrate that is to be subjected to the removal of the electroconductive film, while a dry gas is jetted to the rotation center of the other surface that is not subjected to the removal of the electroconductive film.

9 Claims, 7 Drawing Sheets

METHOD FOR MANUFACTURING ELECTRO-OPTIC DEVICE

BACKGROUND

1. Technical Field

The present invention relates to a method for manufacturing an electro-optic device in which an electroconductive film is removed from a substrate by applying a chemical agent onto the rotating substrate.

2. Related Art

As is generally known, an electro-optic device, such as a liquid crystal device, includes two substrates, which may be made of glass or quartz, and a liquid crystal layer disposed between the two substrates. One of the substrates has switching elements, such as thin-film transistors (hereinafter simply referred to as transistors), and pixel electrodes. The switching elements and the pixel electrodes are arranged in a matrix manner in the substrate. The other substrate has an opposing electrode. Such a structure allows the optical characteristics of the liquid crystal layer between the two substrates to change according to image signals, and thus allows an image to be displayed.

More specifically, image signals are transmitted to the plurality of pixel electrodes arranged in a matrix manner through the switching elements, such as the transistors, and voltages according to the image signals are applied to the liquid crystal layer between the pixel electrodes and the opposing electrode to change the molecular arrangement of the liquid crystal. Consequently, the transmittance of the pixels is varied, so that light passing through the pixel electrodes and the liquid crystal layer is changed according to the image signals and thus an image is displayed.

The element substrate having the transistors and the opposing substrate disposed so as to oppose the element substrate each include a thin layer, an insulating thin layer, and an electroconductive thin layer that are formed in predetermined patterns on, for example, a quartz base substrate by repeating thin-layer formation and etching for each layer.

The formation of the thin layers of the element substrate and opposing substrate uses a film-forming apparatus, such as low-pressure chemical vapor deposition (LP-CVD) apparatus or a sputtering apparatus, and the resulting thin layers are etched with an etching apparatus, such as a dry etching apparatus or a wet etching apparatus, as is generally known.

In processes of the thin layer formation and the etching, the surfaces of the quartz base substrates of the element substrate and the opposing substrate are each subjected to film formation and etching. For a sheetfed process, the rear surface of the quartz base substrate is processed generally on the stage or the like of a film-forming apparatus or an etching apparatus. In this instance, the rear surface of the quartz base substrate may be undesirably scratched or flawed by contact with the stage or the like. The rear surface of the quartz base substrate may also be scratched or flawed during transportation by contact with a carrier on which the quartz substrate is placed.

Accordingly, JP-A-2001-339069 has proposed a method for manufacturing an electro-optic device capable of preventing such a scratch or flaw caused at the rear surface of the quartz base substrate by contact during film formation or etching. In the method, an electroconductive polysilicon film is formed over the entire front and rear surfaces of the quartz base substrate before the formation of thin layers on the base substrate, and then the thin layers are formed on the polysilicon film of the front surface, followed by etching. Thus, the polysilicon film formed on the rear surface of the substrate can protect the rear surface from scratches or flaws caused by contact during film formation and etching.

The quartz base substrate placed on the stage of a film-forming apparatus or an etching apparatus is fixed on the stage with a known electrostatic chuck. This is because the electrostatic chuck can generally serve to uniformize the heat conduction in the quartz base substrate during film formation or etching and to control the temperature of the quartz base substrate. However, the base substrate is an insulator and electrostatic force does not occur between the stage and the quartz base substrate after applying a voltage.

On the other hand, the polysilicon film is electroconductive. As disclosed in the above JP-A-2001-339069, the polysilicon film formed on the rear surface of the quartz base substrate allows an electrostatic force to occur between the polysilicon film and the stage by applying a voltage. Thus, the quartz base substrate can be easily fixed on the stage by the electrostatic chuck. The polysilicon film on the rear surface of the quartz base substrate becomes unnecessary after the thin layers are formed on the front surface of the quartz base substrate, and the rear polysilicon film is finally removed by etching or the like.

In the method disclosed in the above patent document JP-A-2001-339069F, when the polysilicon film is removed from the rear surface of the quartz base substrate, a resist layer is formed over the uppermost layer of the thin layers on the front surface of the base substrate so as to cover the entirety of the thin layers in order to protect the thin layers. Then, the polysilicon film on the rear surface is removed with the quartz base substrate turned upside down by wet etching using a chemical agent, and finally the resist layer is removed with, for example, $O_2$ plasma.

However, this technique requires the four steps of forming a resist layer, tuning the quartz substrate upside down, wet-etching the polysilicon film, and removing the resist layer, for removing the polysilicon film from the rear surface of the quartz base substrate.

Accordingly, in order to reduce the number of steps in the manufacturing process of electro-optic devices, a method is desired in which the polysilicon film can be removed from the rear surface of the base substrate through a minimized number of steps. The same applies to the case in which the polysilicon film on the front surface is removed at one time before thin layers are formed on the front surface of the base substrate.

SUMMARY

An advantage of some aspects of the present invention is that it provides a method for manufacturing an electro-optic device in which an electroconductive film can be removed from the front or rear surface of a substrate of the electro-optic device through a minimized number of steps.

According to an aspect of the invention, a method for manufacturing an electro-optic device is provided which includes: an electroconductive film forming step that forms an electroconductive film over surfaces of a substrate; a front electroconductive film removing step that removes the electroconductive film from the front surface of the substrate; a thin layer forming step that forms thin layers on the front surface of the substrate; and a rear electroconductive film removing step that removes the electroconductive film from the rear surface of the substrate after the thin layer forming step. In this method, at least one of the front electroconductive film removing step and the rear electroconductive film removing step is performed by applying a chemical agent capable of etching with the substrate rotated, to the rotation center of the surface of the substrate that is to be subjected to the removal of the electroconductive film, while a dry gas is jetted to the rotation center of the other surface that is not subjected to the removal of the electroconductive film.

The resulting electro-optic device may includes a first substrate, a second substrate opposing the first substrate with a sealant therebetween, and an electro-optic material in at least a display region between the first and second substrates, and the substrate on which the electroconductive film is formed is at least one substrate before the thin layer forming step of the first substrate and the second substrate.

The electroconductive film formed over the rear surface of the substrate is intended to protect the rear surface from scratches or flaws caused by contact during the manufacturing process, to uniformize the heat conduction in the substrate when it is heated, and for an electrostatic chuck to fix the substrate on the stage or the like. The method allows the electroconductive film to be removed easily from the rear surface of the substrate through a minimized number of steps.

The substrate may be a large substrate, and the electroconductive film forming step, the front electroconductive film removing step, and the rear electroconductive film removing step are performed on the large substrate.

In this instance, the electroconductive film formed over the rear surface of the large substrate protects the rear surface of the large substrate from scratches or flaws caused by contact during the manufacturing process, uniformizes the heat conduction in the large substrate when it is heated, and serves for an electrostatic chuck to fix the large substrate on the stage of a film forming apparatus or an etching apparatus. The method allows the electroconductive film to be removed easily from the rear surface of the large substrate through a minimized number of steps.

The thin layer forming step may form on the front surface of the substrate a plurality of thin layers whose uppermost layer is an electrode that applies a driving voltage to the electro-optic material.

The rear electroconductive film removing step may be performed after the formation of the electrode.

Thus, the electroconductive film remains during the formation of the thin layers until the electrode is formed as the uppermost layer over the substrate. Consequently, the electroconductive film can protect the rear surface of the substrate from scratches or flaws caused by contact during the manufacturing process, uniformize the heat conduction in the substrate, and generate an electrostatic force sufficient for an electrostatic chuck to fix the substrate on the stage of a film forming apparatus or an etching apparatus.

The surface that is to be subjected to the removal of the electroconductive film may be the front surface of the substrate, and the other surface that is not subjected to the removal of the electroconductive film may be the rear surface of the substrate. The front electroconductive film removing step is performed by applying the chemical agent with the substrate rotated, to the rotation center of the electroconductive film over the front surface of the substrate, while the dry gas is jetted to the rotation center of the electroconductive film over the rear surface of the substrate.

By jetting a dry gas to the rotation center of the electroconductive film of the rear surface of the substrate while a chemical agent is applied to the rotation center of the electroconductive film to be removed from the front surface of the substrate, the dry gas prevents the chemical agent from running to the electroconductive film of the rear surface, and thus prevents the removal of the rear electroconductive film. Thus, only the front electroconductive film can be easily and certainly removed through a minimized number of steps.

Alternatively, the surface that is to be subjected to the removal of the electroconductive film may be the rear surface of the substrate, and the other surface that is not subjected to the removal of the electroconductive film may be the front surface of the substrate. The rear electroconductive film removing step is performed by jetting the dry gas with the substrate rotated, to the rotation center of the front surface of the substrate, while the chemical agent is applied to the rotation center of the electroconductive file over the rear surface of the substrate.

By jetting a dry gas to the rotation center of the front surface of the substrate while a chemical agent is applied to the rotation center of the electroconductive film to be removed from the rear surface of the substrate, the dry gas prevents the chemical agent from running to the thin layers formed on the front surface of the substrate, and thus prevents the removal of the layers. Thus, only the rear electroconductive film can be easily and certainly removed through a minimized number of steps.

Preferably, the chemical agent removes only the electroconductive film by wet etching.

Preferably, the electroconductive film is a polysilicon film and the chemical agent is fluoronitric acid that can remove only the polysilicon film.

The dry gas may be $N_2$ gas.

In such a process, the polysilicon film over the front surface of the substrate is removed by applying fluoronitric acid capable of only the polysilicon film to the rotation center of the polysilicon film over the front surface of the rotating substrate, while $N_2$ gas is jetted to the rotation center of the polysilicon film over the rear surface. The $N_2$ gas prevents the fluoronitric acid from running to the rear polysilicon film and thus prevents the removal of the polysilicon film from the rear surface of the substrate. Thus, only the polysilicon film over the front surface of the substrate can be easily and certainly removed through a minimized number of steps by wet etching using fluoronitric acid. The polysilicon film over the rear surface of the substrate is removed by applying fluoronitric acid capable of only the polysilicon film to the rotation center of the polysilicon film over the rear surface of the rotating substrate, while $N_2$ gas is jetted to the rotation center of the front surface. The $N_2$ gas prevents the fluoronitric acid from running to the thin layers formed on the front surface of the substrate and thus prevents the removal of the thin layers. Thus, only the polysilicon film over the rear surface of the substrate can be easily and certainly removed through a minimized number of steps by wet etching using fluoronitric acid.

According to another aspect of the invention, a method for manufacturing an electro-optic device is provided which includes an electroconductive film forming step that forms an electroconductive film over surfaces of a substrate; a first electroconductive film removing step that removes the electroconductive film from one of the surfaces of the substrate; a thin layer forming step that forms layers on the one surface of the substrate; and a second electroconductive film removing step that removes the electroconductive film from the surface opposite the one surface having the thin layers after the thin layer forming step. At least one of the first electroconductive film removing step and the second electroconductive film removing step is performed by applying a chemical agent capable of etching onto the surface that is to be subjected to the removal of the electroconductive film with the substrate rotated, while a dry gas is jetted onto the opposite surface that is not subjected to the removal of the electroconductive film.

The electroconductive film formed over one surface of the substrate is also intended to protect that surface from scratches or flaws caused by contact during the manufacturing process, to uniformize the heat conduction in the substrate when it is heated, and for an electrostatic chuck to fix the substrate on the stage or the like. The method allows the electroconductive film to be removed easily from that surface of the substrate through a minimized number of steps.

BRIEF DESCRIPTION OF THE DRAWINGS

The invention will be described with reference to the accompanying drawings, wherein like numbers reference like elements.

DESCRIPTION OF EXEMPLARY EMBODIMENTS

An embodiment of the invention will now be described with reference to the drawings. In the embodiment below, a liquid crystal device will be illustrated as an example of the electro-optic device of the invention. The liquid crystal device includes a pair of substrates opposing each other. One of the pair of substrates may be an element substrate (hereinafter referred to as TFT substrate), or a first substrate, and the other may be an opposing substrate, or a second substrate opposing the first substrate.

Figure 1:
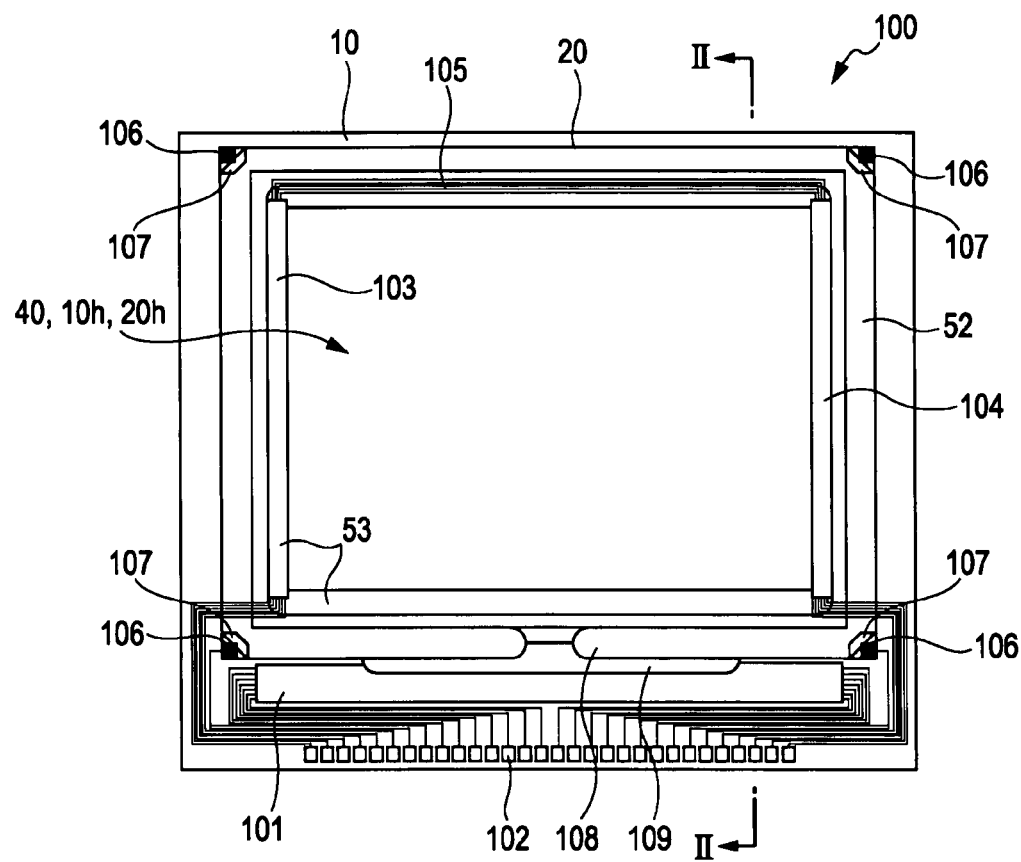
FIG. 1 is a plan view of a liquid crystal device produced according to an embodiment of the present invention.
Figure 2:
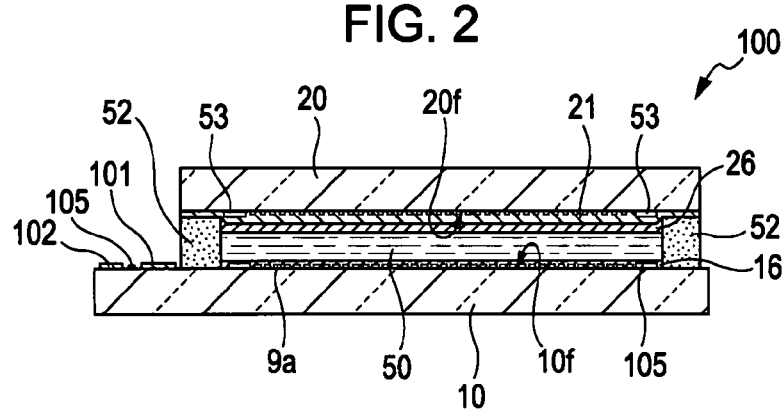
FIG. 2 is a sectional view taken along line II-II in FIG. 1.
Figure 3:
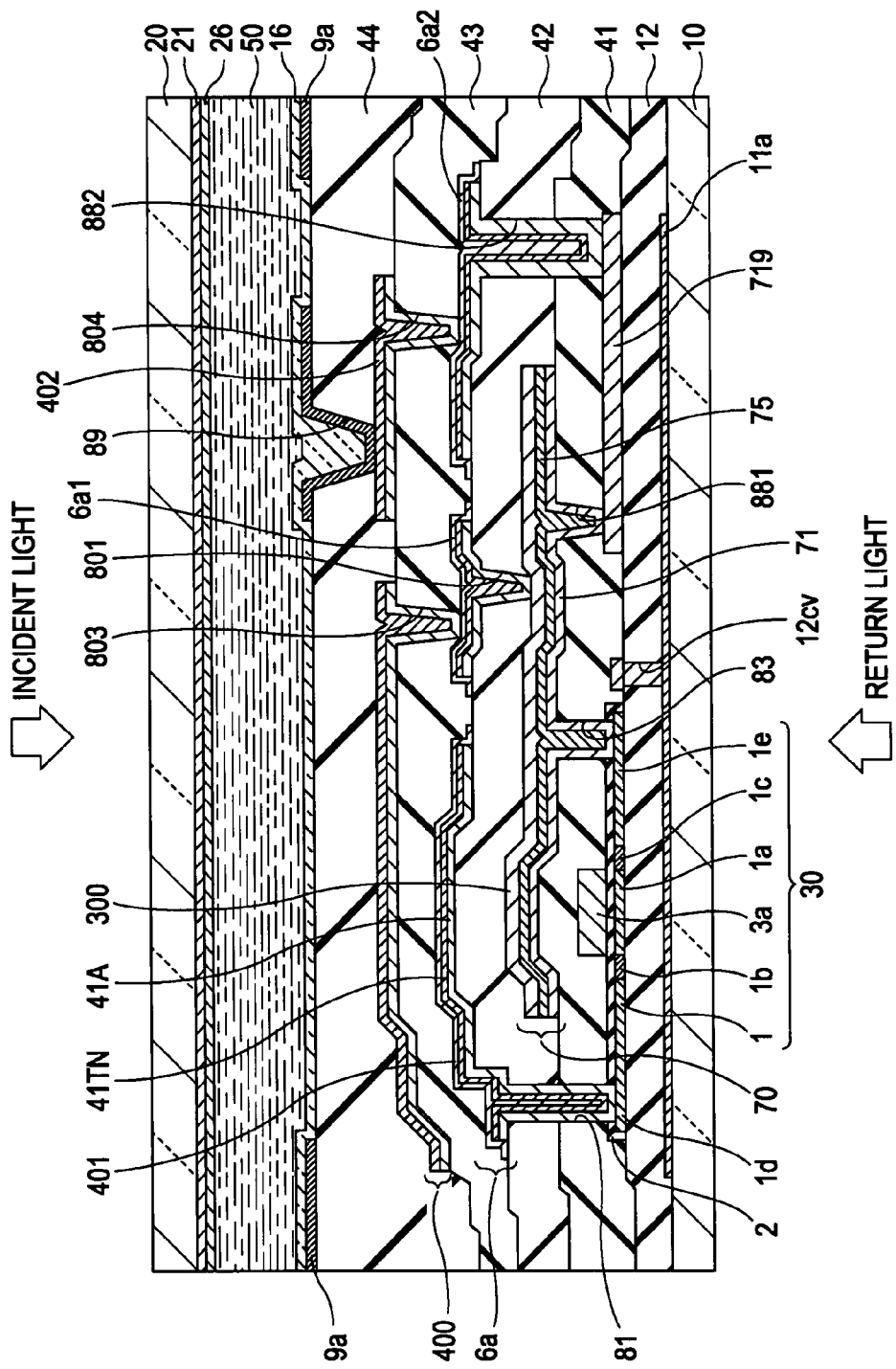
FIG. 3 is a schematic sectional view showing one of the pixels of the liquid crystal device shown in FIG. 1.

First, the entire structure of the liquid crystal device produced by a manufacturing method according to an embodiment of the invention will be described. FIG. 1 is a plan view of the liquid crystal device produced according to the embodiment; FIG. 2 is a sectional view taken along line II-II in FIG. 1; and FIG. 3 is a schematic sectional view showing one of the pixels of the liquid crystal device shown in FIG. 1.

As shown in FIGS. 1 and 2, the liquid crystal device 100 includes a TFT substrate 10 made of, for example, quartz or glass, an opposing substrate 20 opposing the TFT substrate 10 and made of, for example, glass or quartz, and a liquid crystal 50 being an electrooptic material between the two substrates. The TFT substrate 10 and the opposing substrate 20 are bonded together with a sealant 52.

The TFT substrate 10 has a TFT substrate display region 10h for a device display region 40 of the liquid crystal device 100 at the surface 110f adjacent to the liquid crystal 50. In the TFT substrate display region 10h, pixel electrodes (ITO) 9a are arranged in a matrix manner. Each pixel electrode 9a constitutes a pixel, and applies a driving voltage to the liquid crystal 50 with an opposing electrode 21 described below.

The opposing substrate 20 has the opposing electrode (ITO) 21 over the entire surface 20f adjacent to the liquid crystal 50. The opposing electrode 21 applies a driving voltage to the liquid crystal 50 with the pixel electrodes 9a. The opposing electrode 21 has an opposing substrate display region 20h for the device display region 40 of the liquid crystal device 100 at the surface 20f adjacent to the liquid crystal 50 in the region opposing the TFT substrate display region 10h.

The pixel electrodes 9a of the TFT substrate 10 are covered with an alignment layer 16 that has been subjected to rubbing, and the opposing electrode 21 formed over the entire surface of the opposing substrate 20 is also covered with an alignment layer 26 that has been subjected to rubbing. The alignment layers 16 and 26 are made of a transparent organic film, such as a polyimide film.

In the TFT substrate display region 10h, a plurality of scanning lines 11a (see FIG. 3) and a plurality of data lines 6a (see FIG. 3) intersect each other in such a manner that the pixel electrodes 9a are arranged in a matrix manner in sections surrounded by the scanning lines 11a and the data lines 6a. Thin film transistors (hereinafter referred to as TFTs) 30 acting as switching elements are provided corresponding to the intersections of the scanning lines 11a and the data lines 6a (see FIG. 3). The TFTs 30 are each electrically connected to the corresponding pixel electrode 9a.

The TFT 30 is energized by an ON signal from the scanning line 11a, and consequently an image signal transmitted to the data line 6a is transmitted to the pixel electrode 9a. The voltage between the pixel electrode 9a and the opposing electrode 21 of the opposing substrate 20 is applied to the liquid crystal 50.

In addition, storage capacitors 70 (see FIG. 3) are provided in parallel with the pixel electrodes 9a. The storage capacitor 70 allows the voltage of the pixel electrode 9a to be held for a time period, for example, several thousand times longer than the time period for which a source voltage is applied. The storage capacitor 70 enhances the ability of holding voltage, and thus contributes to displaying high-contrast images.

A light-shielding film 53 is formed on the opposing substrate 20 to act as the ends of the TFT substrate display region 10h and the opposing substrate display region 20h and thus to define the device display region 40.

If the liquid crystal 50 is injected into the space between the TFT substrate 10 and the opposing substrate 20 by a known liquid crystal injection technique, the sealant 52 is applied in such a manner that part of a line of the sealant 52 is lost.

The position where the sealant 52 is lost forms into an injection hole 108 through which the liquid crystal 50 is injected into the space between the TFT substrate 10 and the opposing substrate 20. The liquid crystal injection hole 108 is sealed with a sealing material 109 after injecting the liquid crystal.

In the outer region of the sealant 52, a data line driving circuit 101 and external connection terminals 102 are provided along a side of the TFT substrate 10. The data line driving circuit 101 is a driver that drives data lines (not shown) of the TFT substrate 10 by applying image signals to the data lines at a predetermined timing. The external connection terminals 102 are used for connection to an external circuit.

Along the two sides adjacent to that side, scanning line driving circuits 103 and 104 extend. The scanning line driving circuits 103 and 104 are drivers that apply scanning signals to the scanning lines 11a and gate electrodes 3a of the TFT substrate 10 at a predetermined timing and thus drive the gate electrodes 3a. The scanning line driving circuits 103 and 104 are disposed on the TFT substrate 10 in the inner side of the sealant 52 so as to oppose the light-shielding film 53.

The TFT substrate 10 also has wires 105 extending so as to oppose three sides of the light-shielding film 53. The wires 105 are used for connection of the data line driving circuit 101, the scanning line driving circuits 103 and 104, the external connection terminals 102, and vertically conducting terminals 107.

The vertically conducting terminals 107 are disposed on the TFT substrate 10 in the four corners of the sealant 52. In addition, vertically conducting materials 106 are provided between the TFT substrate 10 and the opposing substrate 20 in such a manner that their lower ends are in contact with the vertically conducting terminals 107 and that their upper ends are in contact with the opposing electrode 21. The vertically conducting materials 106 thus establish electrical continuity between the TFT substrate 10 and the opposing substrate 20.

The TFT substrate 10 has a multilayer structure on the surface of a base substrate made of, for example, quartz or glass, as shown in FIG. 3. The multilayer structure includes various types of components including the TFTs and pixel electrodes. The multilayer structure and the layers of the structure, which have been known, will be briefly described below.

The multilayer structure includes, from below, a first layer including the scanning lines 11a, a second layer including TFTs 30 with gate electrodes 3a, a third layer including the storage capacitors 70, a fourth layer including the data lines 6a, a fifth layer including a shield layer 400, and a sixth layer (uppermost layer) including the pixel electrodes 9a and the alignment layer 16. The first to sixth layers are separated from each other by insulating interlayers described later to prevent short-circuits between the layers.

The first layer includes the scanning lines 11a made of, for example, tungsten silicide and patterned in stripes when viewed from above. The scanning line 11a can block light coming into the TFT 30 from below. A base insulating layer 12 is formed of silicon nitride, silicon oxide, or the like over the scanning lines 11a by, for example, CVD under normal pressure or a reduced pressure.

The second layer includes TFTs 30 with gate electrodes 3a. The TFT 30 has an LDD (lightly doped drain) structure and mainly includes a semiconductor layer 1 made of crystallized silicon, such as polysilicon, the gate electrode 3a, and a gate insulating layer 2 insulating the gate electrode 3a from the semiconductor layer 1.

The semiconductor layer 1 has a channel region 1a in which a channel is formed by an electric field from the gate electrode 3a, a lightly doped source region 1b, a lightly doped drain region 1c, a heavily doped source region 1d, and a heavily doped drain region 1e. The second layer also includes junction electrodes 719 in the same layer with the gate electrode 3a.

The base insulating layer 12 has grooves (contact holes) 12cv having a width as great as the length of the channel of the semiconductor layer 1 extending along the data line 6a, at both sides of the semiconductor layer 1 when viewed from above. The contact holes 12cv allow the scanning line 11a and the gate electrode 3a in the same line to have the same potential.

The third layer includes storage capacitors 70 being capacitor sections. The storage capacitor 70 is constituted of a lower electrode 71 electrically connected to the heavily doped drain region 1e of the TFT 30 and the pixel electrode 9a, a capacitor electrode 300 opposing the lower electrode 71, and a dielectric film 75 acting as a capacitor between the lower electrode 71 and the capacitor electrode 300.

A first insulating interlayer 41 is formed of, for example, silicon nitride or silicon oxide over the TFT 30 or gate electrode 3a and the junction electrode 719, and under the storage capacitor 70.

The first insulating interlayer 41 has contact holes 81 each electrically connecting the heavily doped source region 1d of the TFT 30 to the data line 6a, and extending to pass through a second insulating interlayer 42.

Other contact holes 83 are also formed in the first insulating interlayer 41 and each electrically connects the heavily doped drain region 1e of the TFT 30 to the lower electrode 71 of the storage capacitor 70.

Still other contact holes 881 are also formed in the first insulating interlayer 41 and each electrically connects the lower electrode 71 to the junction electrode 719. Furthermore, still other contact holes 882 are formed in the first insulating interlayer 41 and each electrically connects the junction electrode 719 to a second junction layer 6a2, extending to pass through the second insulating interlayer 42.

The data lines 6a are formed in the fourth layer. Each data line 6a has a three-layer structure including, from below, an aluminum layer 41A, a titanium nitride layer 41TN, and a silicon nitride layer 401.

The fourth layer also has a junction layer 6a1 for the shield layer and a second junction layer 6a2 in the same layer with the data line 6a. Contact holes 801 are each formed in the second insulating interlayer 42 to electrically connect the shield layer junction layer 6a1 to the capacitor electrode 300.

The shield layer 400 is formed in the fifth layer. The fifth layer also has third junction electrodes 402, each acting as a junction layer in the same layer with the shield layer 400.

The third insulating interlayer 43 has contact holes 803 and 804. The contact hole 803 electrically connects the shield layer 400 to the shield layer junction layer 6a1, and the contact hole 804 electrically connects the third junction electrode 402 to the second junction layer 6a2.

The pixel electrodes 9a are formed in a matrix manner, as described above, in the sixth layer. The pixel electrodes 9a are covered with the alignment layer 16. A fourth insulating interlayer 44 is formed under the pixel electrodes 9a. The fourth insulating interlayer 44 has contact holes 89 each electrically connecting the pixel electrode 9a to the third junction electrode 402.

The structure of the liquid crystal device is not limited to the form described above, and various modifications may be made.

A method for manufacturing the liquid crystal device 100 will now be described with reference to FIGS. 1 to 3 used above and FIGS. 4 to 11. The following description will illustrate a method for manufacturing the TFT substrate 10 as an example of the method for manufacturing a liquid crystal device 100. In this embodiment, a large quartz substrate is used for base substrates on which thin layers are formed to produce the TFT substrates 10. In other words, part of the large substrate defines the base substrate being the TFT substrate 10 before forming thin layers.

Figure 4:
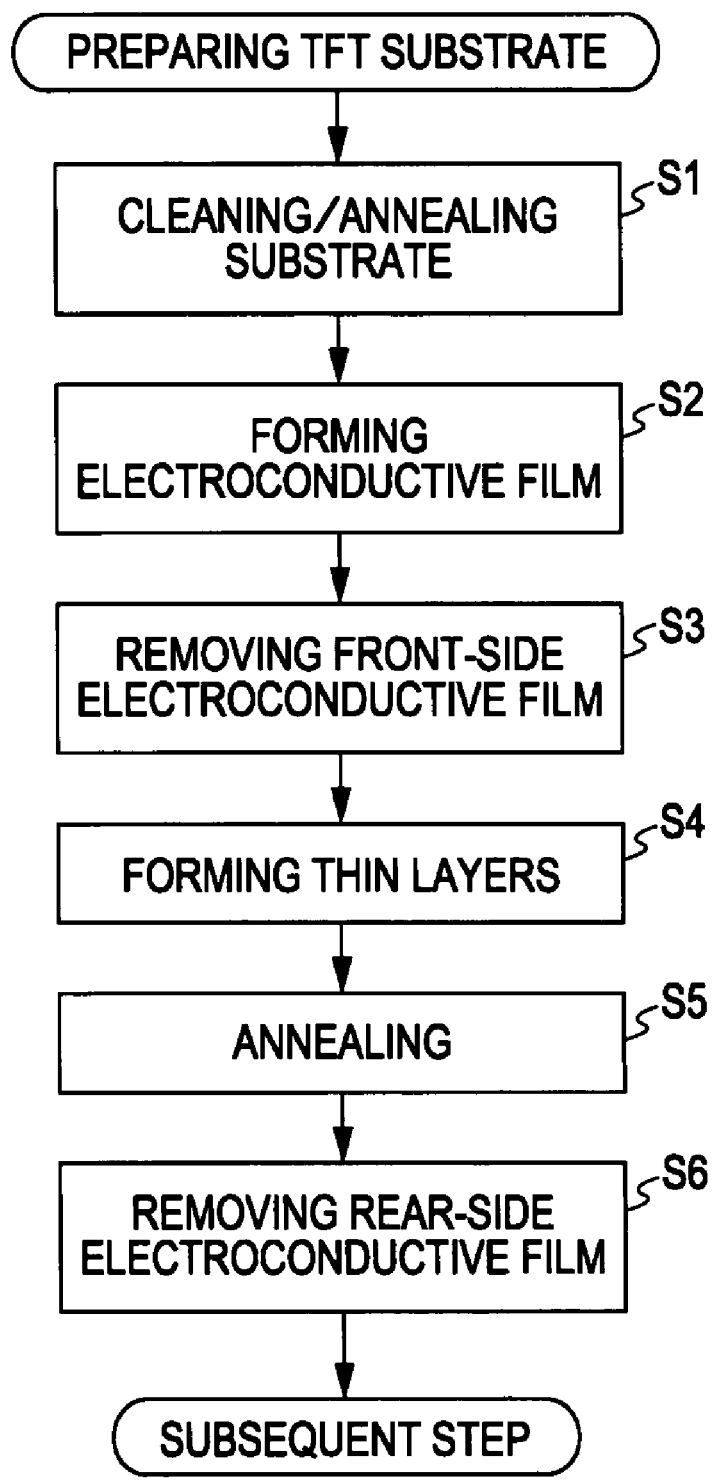
FIG. 4 is a flow chart showing part of a method for manufacturing a TFT substrate.
Figure 5:
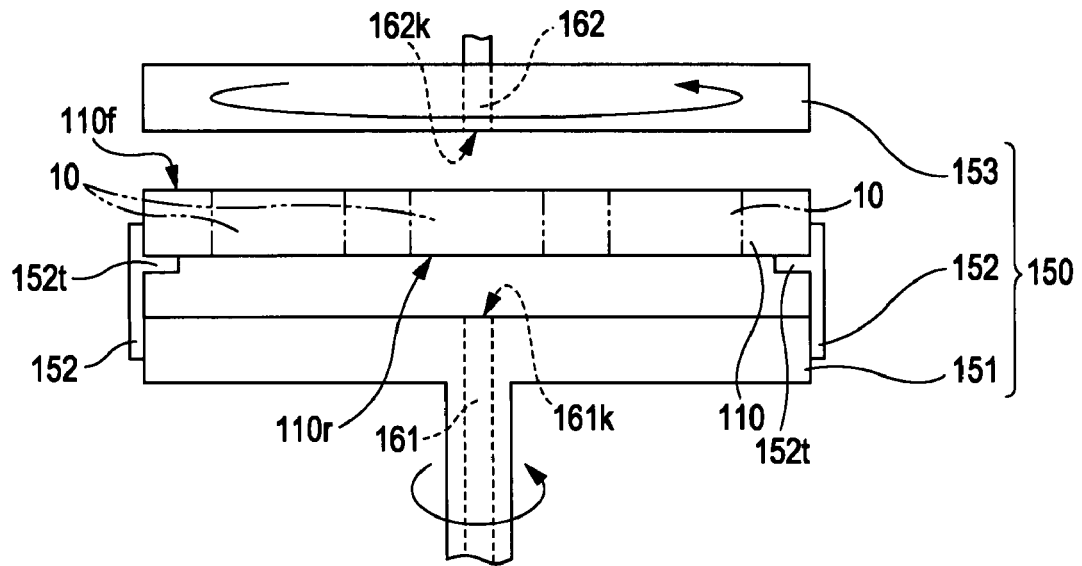
FIG. 5 is a schematic representation of a spin apparatus used for cleaning and drying the front and rear surfaces of a large substrate and for removing an electroconductive film from the front or rear surface of the large substrate.
Figure 6:
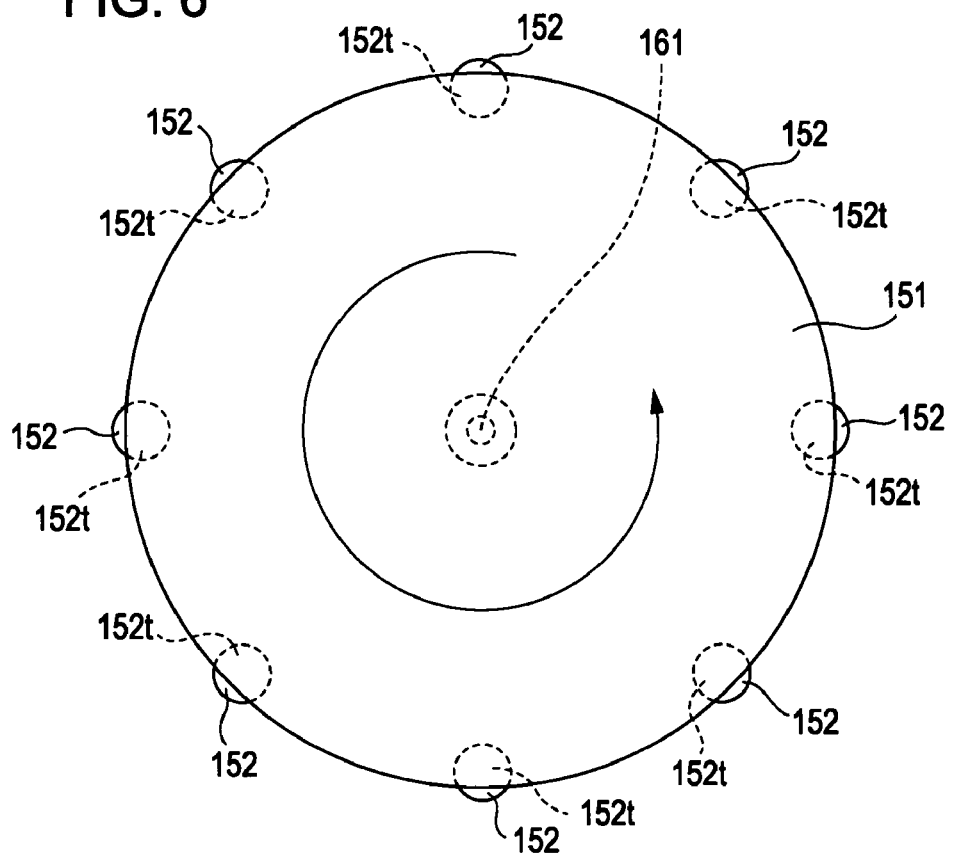
FIG. 6 is a top view showing the spin base and chuck pin of the spin apparatus shown in FIG. 5.

FIG. 4 is a flow chart showing part of the method for manufacturing the TFT substrate; FIG. 5 is a schematic representation of a spin apparatus used for cleaning and drying the front and rear surfaces of a large substrate and for removing an electroconductive film from the front or rear surface of the large substrate; FIG. 6 is a top view showing the spin base and chuck pin of the spin apparatus shown in FIG. 5; and FIG. 7 is a schematic representation of a step that cleans and dries the front and rear surfaces of the large substrate using the spin apparatus shown in FIG. 5.

Figure 7:
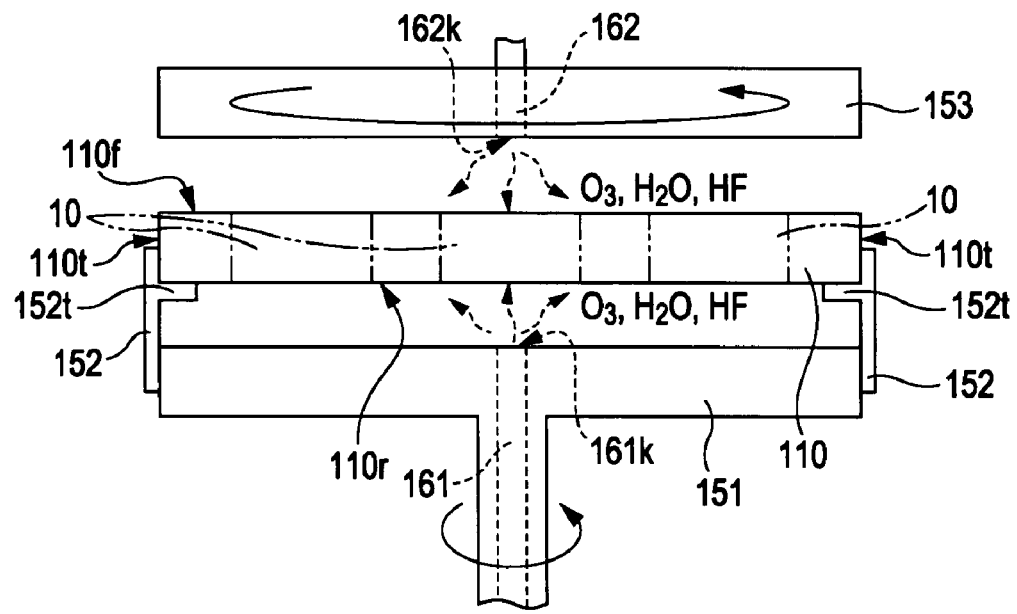
FIG. 7 is a schematic representation of a step that cleans and dries the front and rear surfaces of the large substrate using the spin apparatus shown in FIG. 5.
Figure 8:
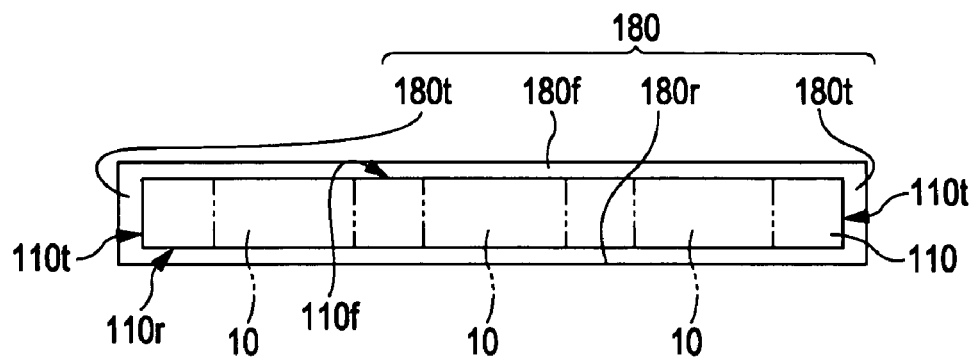
FIG. 8 is a schematic representation of the large substrate shown in FIG. 7 whose front, rear, and side surfaces are covered with a thin film.
Figure 9:
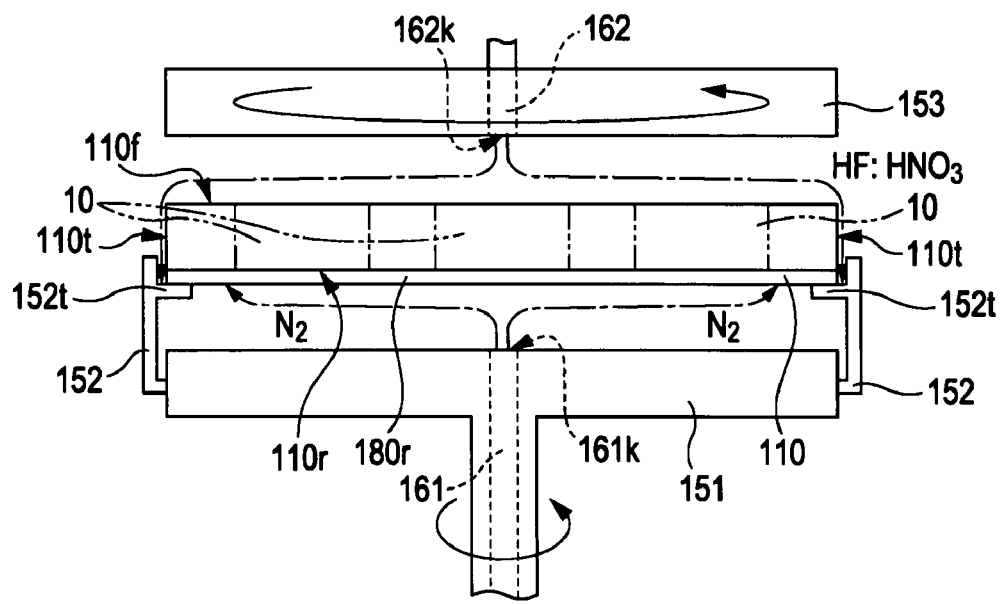
FIG. 9 is a schematic representation of a step that removes the thin film from the front and side surfaces of the large substrate shown in FIG. 8 using the spin apparatus shown in FIG. 5.
Figure 10:
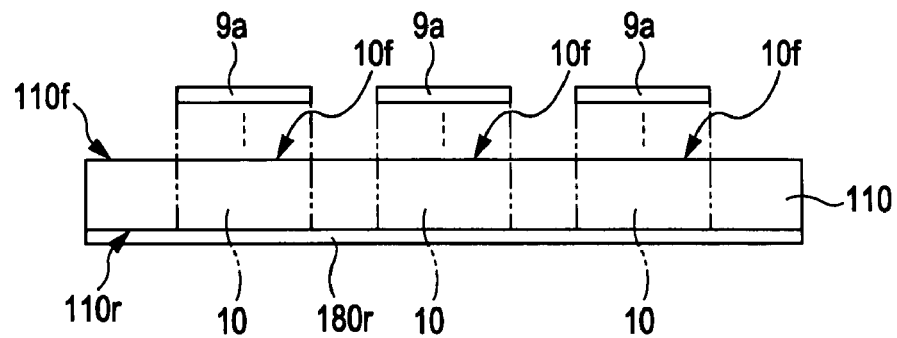
FIG. 10 is a schematic representation of the large substrate shown in FIG. 9 on which a plurality of layers are formed in the regions intended for TFT substrates.
Figure 11:
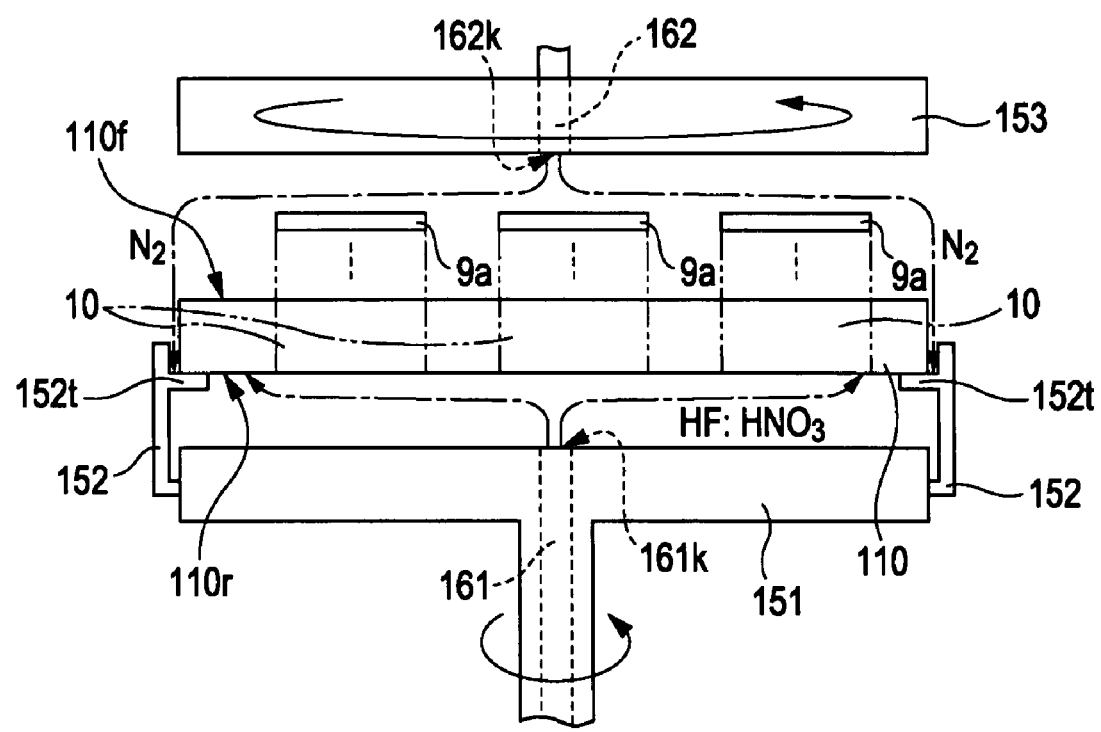
FIG. 11 is a schematic representation of a step that removes the thin film from the rear surface of the large substrate shown in FIG. 10 using the spin apparatus shown in FIG. 5.

FIG. 8 is a schematic representation of the large substrate shown in FIG. 7 whose front, rear, and side surfaces are covered with a thin film; FIG. 9 is a schematic representation of a step that removes the thin film from the front and side surfaces of the large substrate shown in FIG. 8 using the spin apparatus shown in FIG. 5; FIG. 10 is a schematic representation of the large substrate shown in FIG. 9 on which a plurality of layers are formed in the regions intended for TFT substrates; and FIG. 11 is a schematic representation of a step that removes the thin film from the rear surface of the large substrate shown in FIG. 10 using the spin apparatus shown in FIG. 5.

First, as shown in the flow chart FIG. 4, the large quartz substrate (hereinafter referred to as the mother substrate) 110 (see FIG. 5) is cleaned and then dried in a spin apparatus 150 shown in FIG. 5 in Step S1.

The spin apparatus 150 mainly includes a rotatable spin base 151 that may be a circular stage, chuck pins 152 (whose number may be six) fixed at, for example, regular intervals to the periphery of the spin base 151 for holding the mother substrate, and a rotatable shield disc 153 having substantially the same area as the spin base 151, as shown in FIGS. 5 and 6. Among such spin apparatuses 150 is, for example, MP3000 manufactured by DAINIPPON SCREEN MFG. CO., LTD.

The spin base 151 has a delivery hole 161$k$ of a fluid delivery duct 161 through its rotation center. A fluid is delivered to the rear surface 110$r$ of the mother substrate 110 held by the chuck pins 152 through the delivery hole 161$k$.

The shield disc 153 also has a delivery hole 162$k$ of a fluid delivery duct 162 through its rotation center. A fluid is also delivered to the other surface or front surface 110$f$ of the mother substrate held by the chuck pins 152.

The chuck pins 152 are fixed to the periphery of the spin base 151 so as to extend upward from the periphery. On rotating the spin base 151, the chuck pins 152 rotate together with the spin base 151. The number of chuck pins 152 is not limited to 6.

Each chuck pin 152 has a receiver portion 152$t$ protruding in the inward direction of the spin base 151 near its top end. The mother substrate 110 is placed on the receiver portions 152$t$ of the chuck pins 152 in such a manner that the rear surface 110$r$ of the mother substrate 110 is seated on the upper surfaces of the receiver portions 152$t$.

Since the chuck pins 152 extend upward from the periphery of the spin base 151, the mother substrate 110 seated on the receiver portions 152$t$ is located, for example, about 5 mm apart from the spin base 151 upward.

The chuck pins 152 are fixed to the spin base 151 so as to be movable in the diameter direction of the spin base 151. Thus, the mother substrate 110 placed on the receiver portions 152$t$ can be securely fixed with the periphery of the mother substrate 110 held between the inner walls of the chuck pins 152 by shifting the chuck pins 152 in the inward direction of the spin base 151.

The mother substrate 110 is cleaned and dried in such a spin apparatus 150. Specifically, after being held by the chuck pins 152 of the spin apparatus 150, the mother substrate 110 is rotated by rotating the spin base 151. In this instance, the shield disc 153 is rotated simultaneously.

Then, as shown in FIG. 7, $O_3$ (ozone) water, pure water, HF (hydrofluoric acid), pure water, $O_3$ water, and pure water are applied in that order for, for example, 60 seconds each to the rotation centers of the front surface 110$f$ and the rear surface 110$r$ of the rotating mother substrate 110 through the delivery hole 162$k$ of the fluid delivery duct 162 and the delivery hole 161$k$ of the fluid delivery duct 161. The front surface 110$f$ and the rear surface 110$r$ of the mother substrate 110 are thus cleaned. In this instance, each liquid is applied over the entire front surface 110$f$ and rear surface 110$r$ because of the rotation of the mother substrate 110.

Then, the cleaned mother substrate 110 is spin-dried by rotating the spin base 151 for, for example, 60 seconds with no liquid applied through the delivery holes of the fluid delivery ducts 161 and 162. The cleaning and drying the mother substrate may be performed by other means without use of the spin apparatus 150.

After being taken out from the spin apparatus 150, the mother substrate 110 is subjected to annealing using $N_2$ (nitrogen) gas at, for example, 1000° C. for about 300 seconds to prevent the deformation of the mother substrate 110.

Turning back to FIG. 4, an electroconductive film is formed in Step S2. Specifically, an electroconductive polysilicon film 180 is formed to a thickness of, for example, about 100 to 500 nm over the entire front surface 110$f$ and rear surface 110$r$ of the mother substrate 110 with, for example, a batch type vertical LP-CVD system, as shown in FIG. 8. Subsequently, the thickness of the polysilicon film 180 is measured.

The formation of the polysilicon film 180 with the LP-CVD system is performed by, for example, introducing, monosilane ($SiH_4$) gas into the system at 620° C. The polysilicon film 180 is formed on the side surface 110$t$ of the mother substrate 110 as well.

The polysilicon film formed over the front surface 110$f$ of the mother substrate 110 is designated by reference numeral 180$f$; the polysilicon film formed over the rear surface 110$r$ is designated by reference numeral 180$r$; and the polysilicon film formed over the side surface 110$t$ is designated by reference numeral 180$t$.

The polysilicon film 180 has such a thickness as it can protect the rear surface 110$r$ of the mother substrate 110 from scratches or flaws and generate an electrostatic force sufficient to fix the mother substrate 110 on the stage of a sheetfed film forming apparatus or dry etching apparatus by an electrostatic chuck.

The vertical LP-CVD system may perform the formation of the polysilicon film on a plurality of mother substrates 110 at one time. The electroconductive film formed over the front surface 110$f$ and rear surface 110$r$ of the mother substrate 110 is not limited to the polysilicon film, and may be made of polysilicon doped with phosphorus, amorphous silicon, or any other electroconductive material.

After forming the polysilicon film 180$f$ over the front surface 110$f$ of the mother substrate 110, the polysilicon film 180$r$ over the rear surface 110$r$, and the polysilicon film 180$t$ over the side surface 110$t$, a first electroconductive film removing step is performed in Step S3 in FIG. 4. In this step, the polysilicon film 180$f$ of the front surface 110$f$ and the polysilicon film 180$t$ of the side surface 110$t$ are completely removed by a spin technique.

Specifically, the mother substrate 110 is seated on the chuck pins 152 of the spin apparatus 150, and is then rotated by rotating the spin base 151. The shield disc 153 is rotated simultaneously.

Then, the polysilicon film 180f of the front surface 110f of the mother substrate 110 is removed by wet etching as shown in FIG. 9, specifically by applying, for example, fluoronitric acid (HF:HNO$_3$), which is a mixture containing 50% hydrofluoric acid (HF) and 60% nitric acid (HNO$_3$) at a volume ratio of 1:60, to the rotation center of the polysilicon film 180f over the front surface 110f of the mother substrate 110 from above, that is, through the delivery hole 162k of the fluid delivery duct 162 at, for example, 23° C. for at least 25 seconds. For applying the fluoronitric acid onto the polysilicon film 180f of the front surface 110f of the mother substrate 110, the position and orientation of the delivery hole 162k may be appropriately set so that the chemical agent applied to a region other than the rotation center can spread over the entire surface of the mother substrate 110.

The fluoronitric acid can spread over the entire surface of the polysilicon film 180f because of the rotation of the mother substrate 110. Since the fluoronitric acid applied on the front surface 110f runs along the side surface 110t, the polysilicon film 180t of the side surface 110t can also be removed.

The reason why fluoronitric acid is used for removing the polysilicon films 180f and 180t is that fluoronitric acid can etch only the polysilicon film, hardly etching quartz. The etchant used for this etching is preferably has such a selectivity as the ratio of polysilicon etching to quartz (SiO$_2$) etching is at least 1:0.02. In other wards, any chemical agent can be used as the etchant without particular limitation to fluoronitric acid as long as the etchant can etch only a polysilicon film, but not quartz. The chemical agent is not limited to liquid, but may be gas.

The amount of polysilicon films 180f and 180t removed from the front surface 110f and side surface 110t of the mother substrate 110 can be controlled by varying the amount of fluoronitric acid to be applied.

As shown in FIG. 9, a dry gas N$_2$ is jetted to the rotation center of the polysilicon film 180r over the rear surface 110r of the rotating mother substrate 110, which is the opposite surface to the surface from which the electroconductive film is removed, from below or through the delivery hole 161k of the fluid delivery duct 161 at, for example, 100 L/quantity, while the fluoronitric acid is applied to the rotation center of the polysilicon film 180f over the front surface 100f of the rotating mother substrate 110 through the delivery hole 162k of the fluid delivery duct 162. The dry gas is not limited to N$_2$ gas, and may simply be dry air. For jetting N$_2$ gas onto the polysilicon film 180r over the rear surface 110r of the mother substrate 110, the position and orientation of the delivery hole 161k may be appropriately set so that N$_2$ gas jetted to a region other than the rotation center can spread over the entire surface of the mother substrate 110.

The N$_2$ gas jetted to the rear surface 110r can prevent the fluoronitric acid applied to the front surface 110f of the mother substrate 110 from running to the rear surface 110r along the side surface 110t. Thus, the polysilicon film 180r of the rear surface 110r is not removed when the polysilicon film 180f of the front surface 110f is removed.

After the front electroconductive film removing step, the mother substrate 110 has only the polysilicon film 180r over the entire surface of the rear surface 110r. This polysilicon film 180r of the rear surface 110r of the mother substrate 110 is intended to protect the rear surface 110r from scratches or flaws that may be caused by contact during the manufacturing process.

The polysilicon film 180r formed over the entire rear surface 110r of the mother substrate 110 is further intended for an electrostatic chuck for fixing the mother substrate 110 placed on the stage of a sheetfed film forming apparatus or etching apparatus with the rear surface 110r in contact with the stage. The polysilicon film 180r generates an electrostatic force between the mother substrate 110 and the stage, so that the mother substrate 110 is securely fixed on the state.

Furthermore, the polysilicon film 180r formed over the entire rear surface 110r of the mother substrate 110 is intended to uniformize the heat conduction in the mother substrate 110 when it is heated.

After the front electroconductive film removing step, the front surface 110f and rear surface 110r of the mother substrate 110 are cleaned by applying pure water to the rotation centers of the front surface 110f and rear surface 110r of the rotating mother substrate 110 through the delivery hole 162k of the fluid delivery duct 162 and the delivery hole 161k of the fluid delivery duct 161 for, for example, 60 seconds. In this instance, the pure water can spread over the entire front surface 110f and rear surface 110r because of the rotation of the mother substrate 110.

Then, the cleaned mother substrate 110 is dried by rotating the spin base 151 for, for example, 60 seconds with no liquid delivered through the delivery holes of the fluid delivery ducts 161 and 162.

The cleaning and the drying may be performed by other means without use of the spin apparatus 150.

Turning now to FIG. 10, a thin layer forming step is performed in Step S4 shown in FIG. 4. Specifically, a plurality of sets of thin layers intended for a plurality of TFT substrates 10 are formed from the first layer to the pixel electrode 9a of the sixth layer, as shown in FIG. 3, on the front surface 110f of the mother substrate 110 from which the polysilicon film 180f has been removed. The alignment layer 16 of the sixth layer is not formed in this stage.

The step of forming the first to sixth layers has been known, and the description is omitted. During the formation of the first to sixth layers, the mother substrate 110 may be fixed on the stage of a sheetfed film forming apparatus or dry etching apparatus by the electrostatic chuck using an electrostatic force generated between the stage and the rear surface 110r of the mother substrate 110 after applying a voltage.

After being taken out from the spin apparatus 150, the mother substrate 110 is subjected to annealing using N$_2$ (nitrogen) gas at, for example, 300° C. for about 300 seconds to prevent the deformation of the thin layers, in Step S5 shown in FIG. 4.

In this instance, the polysilicon film 180r over the rear surface 110r of the mother substrate 110 helps uniform heat conduction in the mother substrate 110.

Finally, in Step S6 in FIG. 4, a second electroconductive film removing step is performed to remove the electroconductive film 180r completely from the rear surface 110r of the mother substrate 110 by a spin technique.

Specifically, the mother substrate 110 is seated on the chuck pins 152 of the spin apparatus 150, as described above, and is then rotated by rotating the spin base 151. The shield disc 153 is rotated together.

Then, the polysilicon film 180r is removed from the rear surface 110r of the mother substrate 110 by wet etching, as shown in FIG. 11. Specifically, a chemical agent is applied to the rotation center of the polysilicon film 180r over the rear surface 110r of the rotating mother substrate 110 from below, that is, through the delivery hole 161k of the fluid delivery duct 161 at, for example, 23° C. for at least 25 seconds. The chemical agent may be fluoronitric acid (HF:HNO$_3$), which is a mixture containing 50% hydrofluoric acid (HF) and 60% nitric acid (HNO$_3$) at a volume ratio of 1:60. The fluoronitric acid can spread over the entire surface of the polysilicon film 180r because of the rotation of the mother substrate 110. For applying the fluoronitric acid onto the polysilicon film 180r of the rear surface 110r of the mother substrate 110, the position and orientation of the delivery hole 161k may be appropriately set so that the chemical agent can spread over the entire surface of the mother substrate 110, as mentioned above.

The chemical agent is not limited to fluoronitric acid, and any agent may be used. Also, the chemical agent is not limited to liquid, and may be gas. The amount of polysilicon film 180r removed from the rear surface 110r of the mother substrate 110 can be controlled by varying the amount of fluoronitric acid to be applied.

As shown in FIG. 11, a dry gas $N_2$ is jetted to the rotation center of the opposite surface to the surface from which the electroconductive film is removed, that is, the front surface 110f of the mother substrate 110, from above or through the delivery hole 162k of the fluid delivery duct 162 at, for example, 100 L/quantity, while the fluoronitric acid is applied to the rotation center of the polysilicon film 180r over the rear surface 110r of the rotating mother substrate 110 through the delivery hole 161k of the fluid delivery duct 161. The dry gas is not limited to $N_2$ gas, but may simply be dry air. For jetting $N_2$ gas onto the polysilicon film 180f over the front surface 110f of the mother substrate 110, the position and orientation of the delivery hole 162k may be appropriately set so that $N_2$ gas jetted to a region other than the rotation center can spread over the entire surface of the mother substrate 110.

The $N_2$ gas jetted to the front surface 110f can prevent the fluoronitric acid applied to the rear surface 110r of the mother substrate 110 from running to the front surface along the side surface 110t. Thus, the thin layers formed on the front surface 10f of each TFT substrate 10 are not removed when the polysilicon film 180r is removed from the rear surface 110r of the mother substrate 110.

After the rear electroconductive film removing step, the front surface 110f and rear surface 110r of the mother substrate 110 are cleaned by applying pure water to the rotation centers of the front surface 110f and rear surface 110r of the rotating mother substrate 110 through the delivery hole 162k of the fluid delivery duct 162 and the delivery hole 161k of the fluid delivery duct 161 for, for example, 60 seconds. In this instance, the pure water can spread over the entire front surface 110f and rear surface 110r because of the rotation of the mother substrate 110.

Then, the cleaned mother substrate 110 is dried by rotating the spin base 151 for, for example, 60 seconds with no liquid delivered through the delivery holes of the fluid delivery ducts 161 and 162. The cleaning and the drying may be performed by other means without use of the spin apparatus 150.

After the drying step, the alignment layer 16 is formed on the pixel electrode 9a and is subsequently subjected to rubbing. Then, the mother substrate 110 is cut into a plurality of TFT substrates 10 with the thin layers by dicing. Only one TFT substrate 10 may be formed using the mother substrate 110, and then completed after cutting out.

The above process can apply to the opposing substrate 20. Although the following description omits the steps of cleaning, drying, and annealing, the process in practice is conducted in the same manner as the process for the TFT substrate 10.

The process for the opposing substrate 20 will now be simply described. First, the electroconductive film forming step is performed to form an electroconductive polysilicon film 180 to a thickness of, for example, 100 to 500 nm over the entire front surface 110f and rear surface 110r of a quartz mother substrate 110. Then, the front electroconductive film removing step is performed to remove the polysilicon film 180f completely from the front surface 110f of the mother substrate 110 using the spin apparatus 150.

Then, a thin layer forming step is performed to form the opposing electrode 21 on the front surface 110f of the mother substrate 110 from which the polysilicon film 180f has been removed. The alignment layer 26 is not formed in this stage. Subsequently, the rear surface electroconductive film removing step is performed to remove the polysilicon film 180r over the rear surface 110r of the mother substrate 110 completely from the rear surface 110r using the spin apparatus 150.

After the rear electroconductive film removing step, the alignment layer 26 is formed on the opposing electrode 21 on the front surface 110f of the mother substrate 110, and is subsequently subjected to rubbing. Then, the mother substrate 110 is cut into pieces with a predetermined size by, for example, dicing. Thus, a plurality of opposing substrates 20 with layers are cut out from the mother substrate 110. Only one opposing substrate 20 may be formed using the mother substrate 110, and then completed after cutting out.

Finally, the resulting TFT substrate 10 and opposing substrate 20 are bonded together with a sealant 52 in such a manner that their front surfaces 10f and 20f oppose each other, and the liquid crystal 50 is injected, if liquid crystal injection is required, into the region surrounded by the sealant 52 between the TFT substrate 10 and the opposing substrate 20. Thus, a liquid crystal device 100 is completed.

In the present embodiment for preparing a substrate, the polysilicon film 180f is removed from the front surface 110f of the mother substrate 110 by applying fluoronitric acid to the rotation center of the polysilicon film 180f over the front surface 110f of the rotating mother substrate 110 using the spin apparatus 150 while $N_2$ gas is jetted to the rotation center of the polysilicon film 180r over the rear surface 110r.

In this spin technique, in which fluoronitric acid for removing the polysilicon film 180f is applied to the rotation center of the polysilicon film 180f over the front surface 110f of the rotating mother substrate 110 while $N_2$ gas is jetted to the rotation center of the polysilicon film 180r over the rear surface 110r, the $N_2$ gas prevents the fluoronitric acid from running to the polysilicon film 180r of the rear surface 110r of the mother substrate 110, and thus prevents the removal of the rear polysilicon film 180r. In the method for manufacturing the electro-optic device according to the embodiment, only the polysilicon film 180f of the front surface 110f of the mother substrate 110 and the polysilicon film 180t of the side surface 110t can be easily and certainly removed by wet etching using fluoronitric acid through a minimized number of steps with no use of resist.

In this method, the polysilicon film 180r formed over the rear surface 110r of the mother substrate 110 is intended to protect the rear surface 110r of the mother substrate 110 from scratches or flaws that may be caused by contact, to uniformize the heat conduction in the mother substrate 110 when it is heated, and to be used for an electrostatic chuck that fixes the mother substrate 110 to the stage of a film forming apparatus, an etching apparatus, or the like. The polysilicon film 180r is removed using the spin apparatus 150 by applying fluoronitric acid to the rotation center of the rear polysilicon film 180r of the rotating mother substrate 110 while $N_2$ gas is jetted to the rotation center of the front surface 110f of the mother substrate 110.

In this spin technique, in which fluoronitric acid for removing the polysilicon film 180r is applied to the rotation center of the rear polysilicon film 180r of the rotating mother substrate 110 while $N_2$ gas is jetted to the rotation center of the front surface 110f, the $N_2$ gas prevents the fluoronitric acid from running to the thin layers formed on the front surface of the mother substrate 110, and thus prevents the removal of the layers. Thus, the rear polysilicon film 180r can be easily and certainly removed from the rear surface 110r of the mother substrate 110 by wet etching using fluoronitric acid through a minimized number of steps, without use of resist or turning the mother substrate 110 upside down.

Although the base substrate for the TFT substrate 10 or opposing substrate 20 before forming thin layers is made of quartz in the embodiment, it may be made of glass without particular limitation and the glass substrate can produce the same effect.

Although a plurality of TFT substrates 10 or opposing substrates 20 are prepared from the mother substrate 110 in the embodiment, only one substrate may be prepared. The method can be applied to the process in which a polysilicon film is removed from the front or rear surface of the base substrate of the TFT substrate 10 or the opposing substrate 20.

The liquid crystal device is not limited to the form described above, and various modifications may be made without departing from the scope and sprit of the invention. For example, the liquid crystal device, which is illustrated as an active matrix liquid crystal display module using active elements such as TFTs in the above embodiment, may be an active matrix liquid crystal display module using active elements such as TFDs (thin film diodes) without particular limitation.

Although the electro-optic device described in the embodiment is an liquid crystal device, the electro-optic device may be an electroluminescent device, such as an organic electroluminescent device or an inorganic electroluminescent device, a plasma display device, an FED (field emission display) device, an SED (surface-conduction electron-emitter display) device, an LED (light-emitting diode) display device, an electrophoresis display device, or any other device using a small TV including, for example, a thin cathode-ray tube or a liquid crystal shutter.

The electro-optic device may also be a display device including elements formed on a semiconductor substrate, such as an LCOS (liquid crystal-on-silicon) type. The LCOS type uses a single crystal silicon substrate for the element substrate, and transistors are formed as switching elements for pixels and peripheral circuits on the single crystal silicon substrate. The pixels each include a reflective pixel electrode and an element under the pixel electrode.

The electro-optic device may also be a display device having a pair of electrodes in one of the substrates, such as an IPS (in-plane switching) type, or a display device having a pair of electrodes separated by an insulating layer in one of the substrates, such as FFS (fringe field switching) type.

What is claimed is:

1. A method for manufacturing an electro-optic device, comprising:
   an electroconductive film forming step that forms an electroconductive film over at least a first and second surfaces of a substrate, the first and second surfaces being on opposite sides of the substrate from each other;
   a first electroconductive film removing step that removes the electroconductive film from the first surface of the substrate;
   a thin layer forming step that forms layers on the first surface of the substrate; and
   a second electroconductive film removing step that, after the thin layer forming step, removes the electroconductive film from the second surface, at least one of the first electroconductive film removing step and the second electroconductive film removing step being performed by applying a chemical agent capable of etching the electroconductive film onto one of the first and second surfaces while the substrate is rotated, while jetting a dry gas onto the other of the first and second surfaces.

2. The method according to claim 1, wherein the electro-optic device includes a first substrate, a second substrate opposing the first substrate with a sealant therebetween, and an electro-optic material in at least a display region between the first and second substrates, and the substrate on which the electroconductive film is formed is at least one substrate before the thin layer forming step of the first substrate and the second substrate.

3. The method according to claim 1, wherein the substrate is a large substrate, and the electroconductive film forming step, the front electroconductive film removing step, and the rear electroconductive film removing step are performed on the large substrate.

4. The method according to claim 2, wherein the thin layer forming step forms on the first surface of the substrate a plurality of thin layers whose uppermost layer is an electrode that applies a driving voltage to the electro-optic material.

5. The method according to claim 4, wherein the rear electroconductive film removing step is performed after the formation of the electrode.

6. The method according to claim 1, wherein the surface that is to be subjected to the removal of the electroconductive film is the front surface of the substrate, and the other surface that is not subjected to the removal of the electroconductive film is the rear surface of the substrate, and wherein the front electroconductive film removing step is performed by applying the chemical agent with the substrate rotated, to the rotation center of the electroconductive film over the front surface of the substrate, while the dry gas is jetted to the rotation center of the electroconductive film over the rear surface of the substrate.

7. The method according to claim 1, wherein the chemical agent removes only the electroconductive film by wet etching.

8. The method according to claim 7, wherein the electroconductive film is a polysilicon film, and the chemical agent is fluoronitric acid that can remove only the polysilicon film.

9. The method according to claim 1, wherein the dry gas is $N_2$ gas.

* * * * *